(12) United States Patent
Joyner

(10) Patent No.: US 6,214,699 B1
(45) Date of Patent: Apr. 10, 2001

(54) METHOD FOR FORMING AN ISOLATION STRUCTURE IN A SUBSTRATE

(75) Inventor: Keith A. Joyner, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/281,544

(22) Filed: Mar. 30, 1999

Related U.S. Application Data

(60) Provisional application No. 60/080,345, filed on Apr. 1, 1998.

(51) Int. Cl.$^7$ .................................................... H01L 21/76
(52) U.S. Cl. ........................ 438/445; 438/424; 438/427
(58) Field of Search ................................. 438/424, 427, 438/445

(56) References Cited

U.S. PATENT DOCUMENTS

| | | | |
|---|---|---|---|
| 5,728,621 | * | 3/1998 | Zheng et al. ........................ 438/427 |
| 5,733,383 | * | 3/1998 | Fazan et al. ........................ 438/424 |
| 5,766,823 | * | 6/1998 | Fumitomo ........................... 438/761 |
| 5,817,568 | * | 10/1998 | Chao .................................. 438/427 |
| 5,960,299 | * | 9/1999 | Yew et al. ........................... 438/424 |

OTHER PUBLICATIONS

S. Wolf Silicon Processing for the VSLI Era Vol 1 Lattice Press pp. 529–530, 547–548, 565–567, 1985.*
StanleyWolf Silicon Processing for the VSLI Era Vol 2 Lattice Press pp. 238–239, 1990.*
Wolf, "Silicon Processing for The VLSI Era", vol. 2, 1990, Title Pages and pp. 45–48.

* cited by examiner

*Primary Examiner*—Charles Bowers
*Assistant Examiner*—David S Blum
(74) *Attorney, Agent, or Firm*—Dwight N. Holmbo; Wade James Brady, III; Frederick J. Telecky, Jr.

(57) ABSTRACT

In order to form an isolation structure in a substrate, a blocking layer (13, 14) is fabricated over the substrate (12), after which portions of the blocking layer and the substrate are removed at an isolation region (22). A dielectric layer (26) is then deposited over the blocking layer and the isolation region. Thereafter, a chemical-mechanical polishing process is carried out on the dielectric layer, so as to remove a substantial portion of the dielectric layer disposed above an upper surface of the blocking layer. A non-patterned etch is then carried out on the dielectric layer, in order to remove a remaining portion of the dielectric layer disposed above the upper surface of the blocking layer.

17 Claims, 1 Drawing Sheet

METHOD FOR FORMING AN ISOLATION STRUCTURE IN A SUBSTRATE

This application claims priority under 35 USC §119 (e)(1) of provisional application No. 60/080,345, filed Apr. 1, 1998.

TECHNICAL FIELD OF THE INVENTION

This invention relates in general to semiconductor manufacturing techniques and, more particularly, to a method for forming an isolation structure in a substrate.

BACKGROUND OF THE INVENTION

When a plurality of semiconductor devices are formed in a substrate of single crystalline silicon, the active regions which contain these devices need to be electrically isolated from each other. One approach for effecting this isolation involves the selective removal of portions of the substrate, in order to define a trench or recess where an isolation region is needed. Then, a dielectric layer is introduced into the trench or recess to create the isolation region. In the case of a bulk silicon substrate, such a technique is commonly referred to as shallow trench isolation (STI). In the context of a semiconductor on insulator (SOI) substrate, such a technique is often referred to as mesa isolation.

On a more specific level, this known technique involves applying a blocking layer over the silicon substrate, selectively removing portions of the blocking layer and the substrate where an isolation region is needed, oxidizing, and then depositing the dielectric layer over the blocking layer and in the trench or recess. Then, a chemical-mechanical polishing step is carried out on the dielectric layer in order to remove portions of the dielectric layer disposed above the blocking layer, while leaving a planarized portion of the dielectric layer in the trench or recess. A small portion of the blocking layer may be incidentally removed with the upper portion of the dielectric layer. Although this known technique has been generally adequate for its intended purpose, it has not been satisfactory in all respects.

More specifically, it has been difficult with the chemical-mechanical polishing step to uniformly remove the dielectric material from the blocking layer across an entire wafer. There may be variations across the overall wafer, for example due to factors such as deformation of the polishing pad. There may also be variations on a smaller scale, for example in dependence on the size of respective active regions which are near each other, because the chemical-mechanical polishing process tends to remove material more rapidly over smaller active regions than over larger active regions.

One technique developed to reduce the effects of these problems is to carry out a reverse pattern etch prior to the chemical-mechanical polishing step. The reverse pattern etch selectively removes some of the dielectric material from the larger active regions so that, during the subsequent chemical-mechanical polishing, the removal of dielectric material from the larger active regions is completed at about the same time as the removal of dielectric material from the smaller active regions. However, this has not been entirely effective in eliminating problems, and involves significant added cost, because several additional steps are needed to carry out an etch process which is patterned.

Another known technique is to provide dummy moat or active regions, which are similar to true active regions except that no components are ultimately fabricated in these dummy regions. The purpose of these dummy active regions is to increase the cumulative area of active regions present in certain portions of the wafer, but this approach has also not satisfactorily eliminated the problems in question.

SUMMARY OF THE INVENTION

From the foregoing, it may be appreciated that a need has arisen for a method for forming an isolation structure in a substrate, which provides greater uniformity across a wafer in the removal of an insulating material, and which is simpler and cheaper than known techniques. According to the present invention, a method is provided to address this need, and involves the steps of: providing a substrate; depositing a blocking layer over the substrate; removing portions of the blocking layer and the substrate at an isolation region; depositing a dielectric layer over the blocking layer and the isolation region; chemically-mechanically polishing the dielectric layer so as to remove a portion of the dielectric layer disposed above an upper surface of the blocking layer; and thereafter etching the dielectric layer so as to remove a remaining portion of the dielectric layer disposed above the upper surface of the blocking layer.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
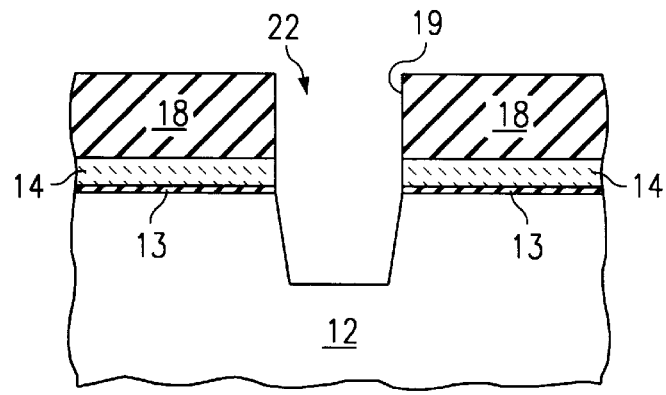
FIGS. 1–4 are each a diagrammatic sectional side view of a semiconductor device, showing successive steps involved in fabricating the device according to a method which embodies the present invention.

FIGS. 1–4 are diagrammatic sectional side views of a portion of an integrated circuit, and depict successive steps during fabrication of the integrated circuit by a method according to the present invention. In FIG. 1, reference numeral 12 designates a semiconductor substrate of single crystalline silicon, which in the disclosed embodiment is a bulk silicon substrate, but could alternatively be the active substrate portion of a semiconductor on insulator (SOI) device.

A pad oxide layer 13 is fabricated on the top surface of the silicon substrate 12. The pad oxide layer 13 is silicon dioxide ($SiO_2$), which is a thermal oxide grown in a known manner by heating the substrate 12 in a furnace in the presence of oxygen. A layer 14 of silicon nitride ($Si_3N_4$) is then fabricated on the pad oxide layer 13. In particular, the silicon nitride layer 14 is isotopically deposited in a known manner, for example using a known low pressure chemical vapor deposition (LPCVD) technique. The pad oxide layer 13 and nitride layer 14 together constitute a blocking layer which serves as an etch stop layer, as discussed in more detail below. The pad oxide layer 13 is optional, and may be omitted, in which case the nitride layer 14 serves as the blocking layer.

A patterned photoresist 18 is then applied to the upper side of the nitride layer 14, and has therethrough an opening 19 disposed over a portion of the substrate which is to be an insulation region. A known etching step is then carried out, in order to etch a shallow isolation trench or recess 22 down through the blocking layer 13–14 and into an upper portion of the silicon substrate 12. The etching which creates the shallow trench 22 is carried out using known etching techniques. Thereafter, the photoresist 18 is removed in a known manner. The portions of the silicon substrate 12 on opposite sides of the trench 22 are active regions in which semiconductor component devices will be fabricated.

A thermal oxide layer 24 is then fabricated on the surfaces of the silicon substrate 12 within the trench 22. This thermal oxide layer 24 is silicon dioxide ($SiO_2$) and, like the pad oxide layer 24, is grown in a known manner by heating the device in a furnace in the presence of oxygen.

Figure 2:
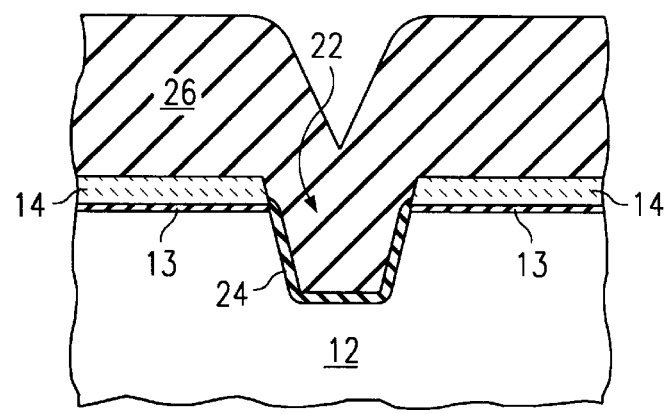

Thereafter, as shown in FIG. 2, a dielectric layer 26 is isotopically deposited over the nitride layer 14 and over the thermal oxide layer 24 in the trench 22, so as to fill the trench 22. The thicker the dielectric layer 26, the greater the amount of dielectric material that will need to be removed later. Therefore, dielectric layer 26 should be deposited only to a thickness sufficient to fill the trench 22 to the top surface of the nitride layer 14. In the disclosed embodiment, the dielectric layer 26 is silicon dioxide ($SiO_2$), deposited using a known chemical vapor deposition (CVD) technique.

Figure 3:
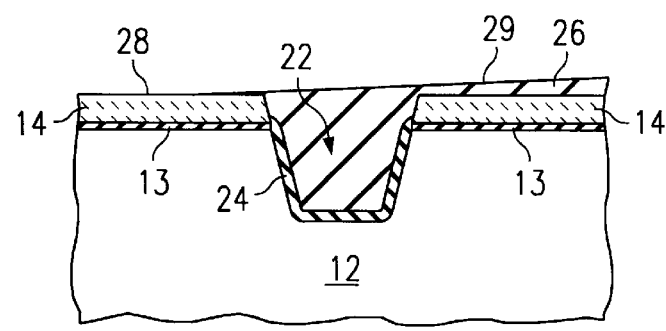

A chemical-mechanical polishing (CMP) step is then carried out on the dielectric layer 26, so as to remove a substantial portion of the material of layer 26 which is disposed vertically above the top surface of the nitride layer 14. After this CMP step, the dielectric layer 26 may appear as shown in FIG. 3. In particular, there may or may not be regions in which the dielectric layer 26 has been completely removed from the nitride layer 14, for example as shown at 28, but across most of the wafer there will be a thin sheet of the dielectric layer 26 still remaining on the nitride layer 14, as shown at 29. The CMP may incidentally remove a small amount of the material of nitride layer 14, but this is acceptable.

The conditions of the CMP step for a given wafer are determined in a known manner, and may depend on factors such as the size of the wafer, the material of the polishing pad, and so forth. In the disclosed method the CMP is a fixed time step, but it will be recognized that it could alternatively be an end-pointed step. For example, the thickness of the oxide remaining on the nitride layer could be measured after carrying out the CMP for an initial predetermined time interval, in order to determine how much longer to carry out CMP after taking the measurement.

After the CMP step, a post-CMP cleanup may be carried out on the semiconductor device, for example using a quick-dump rinse megasonic bath and/or a scrubber system. Suitable post-CMP cleaning techniques are known, and therefore not described here in detail.

Figure 4:
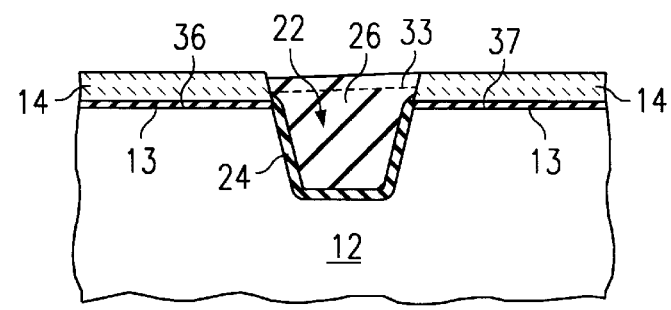

Thereafter, the semiconductor device is placed in a not-illustrated process chamber, and a non-patterned plasma etch is carried out in order to remove remaining portions of the material of dielectric layer 26 which are disposed vertically higher than the top surface of the nitride layer 14. At the completion of this plasma etch step, the device will appear as shown in FIG. 4, where the only remaining material of the dielectric layer 26 is the portion thereof disposed in the trench 22. The uniformity of the removal of the dielectric material 26 from the nitride layer 14 is facilitated by the tendency of the prior CMP step to effect global planarization, which minimizes variations in the thickness of the dielectric material remaining on the nitride layer before the start of the plasma etch step. Although the top surface of the remaining dielectric material 26 should in theory be flush with the top surface of the nitride layer 14, it may in reality be slightly lower than the top surface of nitride layer 14, which is entirely acceptable and which is indicated by the broken line 33 in FIG. 4.

The plasma etch used on the dielectric layer 26 is a standard oxide etch, for example using a fluorine-containing hydrocarbon, such as carbon tetrafluoride ($CF_4$). The conditions of the plasma etch can be determined in a known manner. In this regard, the plasma etch may be a fixed time etch, the duration of which will depend on the maximum thickness of the dielectric material expected to remain on the nitride layer 14 after the CMP step. In the disclosed method, the plasma etch is a fixed time etch with a duration which is predetermined on the basis of particular circumstances, such as the characteristics of the particular wafer design, the thickness of the dielectric layer, and the duration of the CMP step. Alternatively, the thickness of the oxide remaining on the nitride layer could be measured after completion of the CMP step, and used to select a duration for the etching step.

As yet another alternative, the plasma etch could be an endpointed etch, in order to avoid excessive over-etching. More specifically, in a known manner, the etch products from the plasma etch may be spectroscopically analyzed, in order to determine when the rate of oxide removal has decreased sufficiently to indicate that all of the oxide material of dielectric layer 26 has been removed from the top surface of the nitride layer 14.

After the plasma etch, a known post-etch cleanup step may be carried out. In due course, a further selective etch is carried out in order to remove the remaining material of blocking layers 13 and 14, but not the remaining portion of dielectric material 26. This exposes the surface portions 36 and 37 (FIG. 4) of the silicon substrate 12, which represent active regions of the silicon material in which semiconductor components will be fabricated. These active regions each may be alternatively called a moat, or a mesa. The oxide materials 24 and 26 and the trench 22 provide electrical isolation between components in respective active areas. One of the active areas 36 and 37 could alternatively be a dummy active area, which is identical to an active area except that no components are later fabricated therein. A dummy active area helps to ensure uniformity during planarization of the dielectric material 26 using the CMP and plasma etch steps discussed above.

Instead of using a plasma etch on the dielectric layer 26 after the CMP step, the dielectric etch step could alternatively be carried out using a wet etch, for example by immersing the device in a hydrogen fluoride (HF) solution, which may optionally include other components, such as buffers to moderate the etching rate. This would be a standard oxide etch, the conditions of which would be determined in a known manner based on factors such as the thickness of the dielectric material to be removed from the nitride layer following the CMP step. It could be a fixed time etch, or an endpointed etch.

Instead of a plasma etch or wet etch, yet another alternative technique for the etching step would be a vapor phase etch, for example using hydrogen fluoride (HF) vapor, optionally mixed with water vapor. This would also be a standard oxide etch, the particular conditions for which would be determined in a known manner based on factors such as the thickness of the dielectric material to be removed from the nitride layer following the CMP step. It could be a fixed time etch, or an endpointed etch.

The present invention provides a number of technical advantages. One such technical advantage is that the dielectric layer is removed more uniformly from the nitride blocking layer than with known techniques, and in particular is removed relatively uniformly from both narrow and wide active regions of the device. A related technical advantage is that the dielectric is removed more uniformly than with the known technique of using a reverse pattern etch before the CMP step, while avoiding several process steps which are needed for a pattern etch. This reduces the effort and cost required to manufacture the semiconductor device.

Although several variations of the method according to the invention have been described above, it will be understood that there are other changes, substitutions and alterations which can be made without departing from the scope of the present invention. For example, the method has been disclosed in the specific context of a bulk silicon substrate using shallow trench isolation (STI), but it will be recognized that it is equally applicable in other technologies, such as mesa isolation in semiconductor on insulator (SOI) substrates. Similarly, the foregoing disclosure discusses certain suitable etching techniques, such as a plasma etch, wet etch, or vapor phase etch, but it will be recognized that other etching techniques may also be suitable for use in implementing the present invention.

As a further example, the present invention recognizes that the CMP step may completely remove the dielectric material from some portions of the nitride layer, but it will be recognized that the invention also encompasses implementation of the CMP step in a manner so that a small amount of dielectric material remains everywhere on the nitride layer. As still another example, the present application discloses the use of certain suitable materials, but it will be recognized that there are still other materials which may be suitable for use in conjunction with the present invention. It will also be recognized that certain structural features of the semiconductor device shown in the drawings are exemplary, and that the present invention is compatible with a number of other semiconductor device structures. Other changes, substitutions and alterations are also possible without departing from the spirit and scope of the present invention, as defined by the following claims.

What is claimed is:

1. A method for forming an isolation structure in a substrate, comprising the steps of:
    providing a substrate;
    depositing a blocking layer over the substrate;
    removing portions of the blocking layer and the substrate at an isolation region;
    depositing a dielectric layer over the blocking layer and the isolation region;
    chemically-mechanically polishing the dielectric layer to remove a portion of the dielectric layer disposed above an upper surface of the blocking layer; and
    thereafter etching the dielectric layer to remove a remaining portion of the dielectric layer disposed above the upper surface of the blocking layer providing a planar surface.

2. A method according to claim 1, wherein said etching step is a non-patterned etching step.

3. A method according to claim 1, wherein said etching step is carried out for a fixed time interval.

4. A method according to claim 1, wherein said etching step is endpointed.

5. A method according to claim 1, wherein said etching step includes a plasma etch.

6. A method according to claim 5, wherein said dielectric layer is an oxide, and said plasma etch is carried out using a plasma which includes a fluorine-containing hydrocarbon.

7. A method according to claim 5, wherein said plasma etch is endpointed, said plasma etch including the step of spectroscopically monitoring the plasma etch.

8. A method according to claim 1, wherein said etching step includes a wet etch.

9. A method according to claim 8, wherein said dielectric layer is an oxide, and said wet etch is carried out using a hydrogen fluoride solution.

10. A method according to claim 8, wherein said dielectric layer is an oxide, and said wet etch is carried out using a hydrogen fluoride solution which includes buffers.

11. A method according to claim 1, wherein said etching step includes a vapor phase etch.

12. A method according to claim 11, wherein said dielectric layer is an oxide, and said etching step is carried out using a vapor which includes hydrogen fluoride.

13. A method according to claim 1, wherein said polishing step is carried our for a fixed time interval.

14. A method according to claim 1, including between said polishing step and said etching step the step of carrying out a clean-up process.

15. A method according to claim 1, including between said polishing step and said etching step the step of measuring a thickness of the dielectric layer remaining on the blocking layer.

16. A method according to claim 1, including prior to said depositing the step of oxidizing said isolation region.

17. A method for forming an isolation structure in a semiconductor substrate, comprising the steps of:
    providing a substrate;
    depositing a blocking layer on the substrate;
    removing portions of the blocking layer and the substrate at an isolation region;
    depositing a dielectric layer over the blocking layer and the isolation region;
    chemically-mechanically polishing the dielectric layer to remove a portion of the dielectric layer disposed above an upper surface of the blocking layer; and
    thereafter etching the dielectric layer using a non-patterned plasma etch in order to remove a remaining portion of the dielectric layer disposed above the upper surface of the blocking layer providing a planar surface.

* * * * *